(12) United States Patent
Na et al.

(10) Patent No.: US 8,745,288 B2
(45) Date of Patent: Jun. 3, 2014

(54) DATA TRANSFER CIRCUIT AND MEMORY DEVICE HAVING THE SAME

(75) Inventors: Hyoung-Jun Na, Gyeonggi-do (KR); Jae-Il Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 189 days.

(21) Appl. No.: 13/329,865

(22) Filed: Dec. 19, 2011

(65) Prior Publication Data

US 2012/0221750 A1   Aug. 30, 2012

(30) Foreign Application Priority Data

Feb. 28, 2011   (KR) .................. 10-2011-0017827

(51) Int. Cl.
G06F 13/00        (2006.01)
G06F 13/38        (2006.01)

(52) U.S. Cl.
USPC ................. 710/35; 710/33; 710/65; 710/71; 370/351; 370/356

(58) Field of Classification Search
None
See application file for complete search history.

(56) References Cited

U.S. PATENT DOCUMENTS

| | | | | |
|---|---|---|---|---|
| 5,757,822 A * | 5/1998 | Fisher et al. | | 714/755 |
| 6,202,120 B1 * | 3/2001 | Lang et al. | | 711/5 |
| 6,701,396 B2 * | 3/2004 | Okajima | | 710/71 |
| 8,489,839 B1 * | 7/2013 | Karandikar et al. | | 711/167 |
| 2002/0172184 A1 * | 11/2002 | Kim et al. | | 370/344 |
| 2003/0051124 A1 * | 3/2003 | Dowling | | 712/244 |
| 2006/0268624 A1 * | 11/2006 | Jang | | 365/189.01 |
| 2008/0209089 A1 * | 8/2008 | Mo et al. | | 710/71 |
| 2009/0086564 A1 * | 4/2009 | Yang et al. | | 365/230.08 |
| 2009/0154271 A1 * | 6/2009 | Kwean | | 365/201 |
| 2010/0332701 A1 * | 12/2010 | Murayama | | 710/71 |

FOREIGN PATENT DOCUMENTS

| | | |
|---|---|---|
| JP | 2001-035159 | 2/2001 |
| JP | 2008-052878 | 3/2008 |
| KR | 10-2000-0062116 | 10/2000 |
| KR | 1020050065269 | 6/2005 |
| KR | 1020060121523 | 11/2006 |

OTHER PUBLICATIONS

Notice of Allowance issued by the Korean Intellectual Property Office on May 7, 2013.

Office Action issued by the Korean Intellectual Property Office on Aug. 6, 2012.

* cited by examiner

*Primary Examiner* — Michael Sun
(74) *Attorney, Agent, or Firm* — IP & T Group LLP

(57) ABSTRACT

A data transfer circuit includes a serial-to-parallel converter configured to convert multi-bit data inputted in series into parallel data by controlling the number of bits of the parallel data and a conversion timing based on an operation mode, and a data transmission unit configured to transfer the parallel data to a first data path or a second data path based on the operation mode.

16 Claims, 9 Drawing Sheets

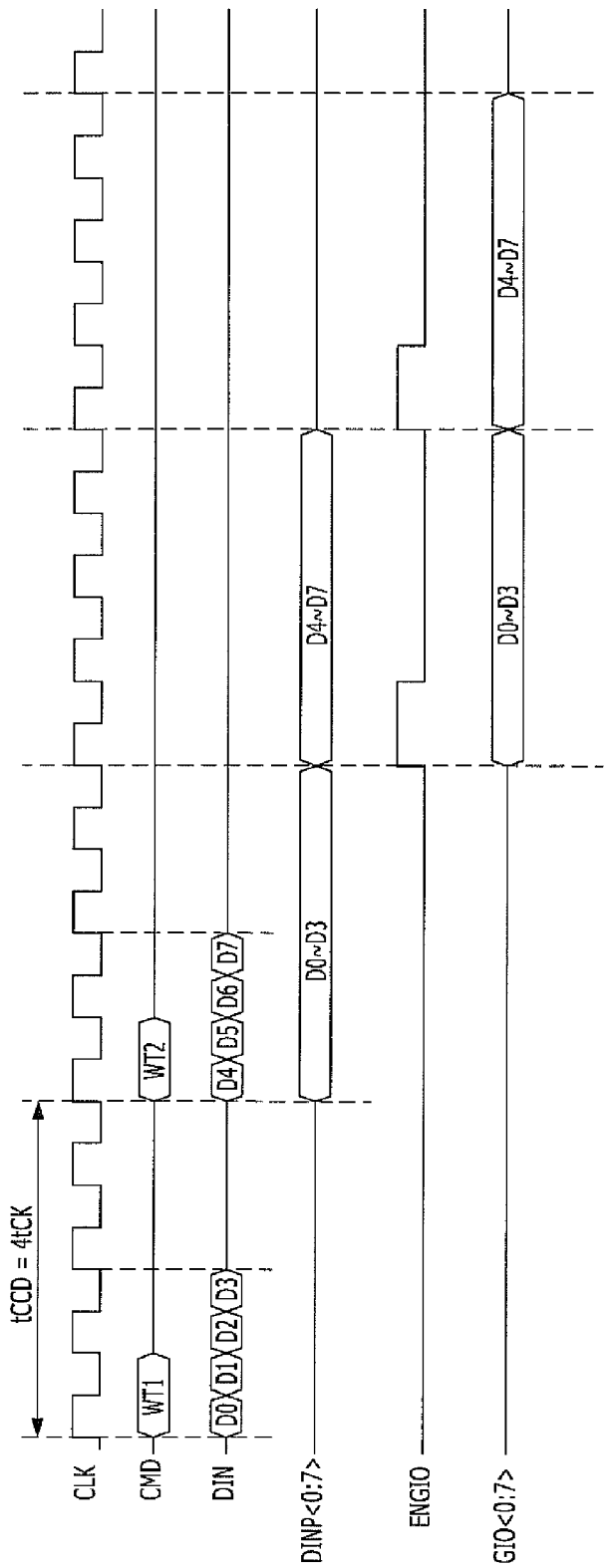

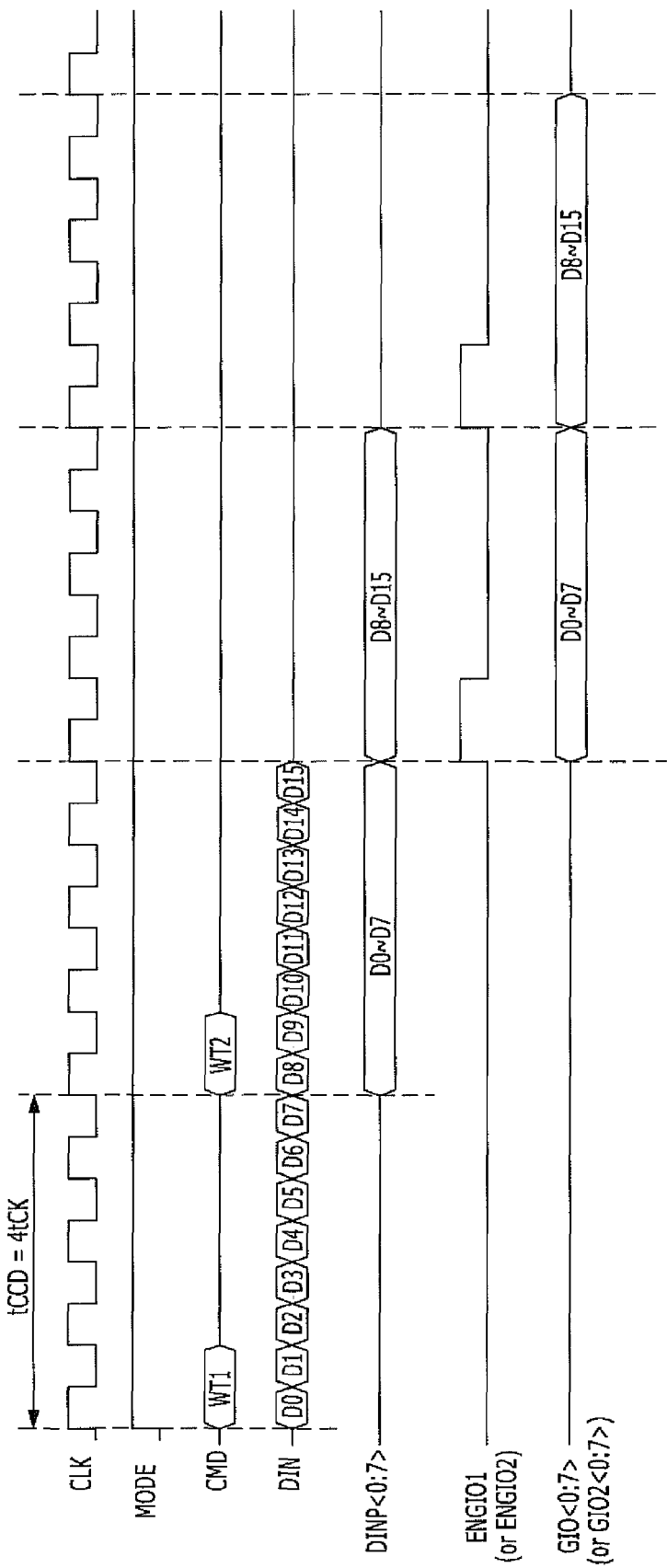

DATA TRANSFER CIRCUIT AND MEMORY DEVICE HAVING THE SAME

CROSS-REFERENCE TO RELATED APPLICATIONS

The present application claims priority of Korean Patent Application No. 10-2011-0017827, filed on Feb. 28, 2011, which is incorporated herein by reference in its entirety.

BACKGROUND

1. Field

Exemplary embodiments of the present invention relate to a data transfer circuit which receives and transfers data in the inside of a semiconductor chip, and a memory device including the data transfer circuit.

2. Description of the Related Art

As semiconductor related technologies are being advanced, operation speeds of semiconductor memory devices are becoming faster. A Synchronous Dynamic Random Access Memory (SDRAM) device operates in synchronization with an external clock. Recently, a Double Data Rate (DDR) SDRAM device is developed and used. The DDR SDRAM device is designed to have a high data transfer rate by synchronizing input/output data with a clock not only at a rising edge but also at a falling edge as well.

A DDR SDRAM device is advanced from DDR1 to DDR2 and DDR3. In case of DDR1, 2-bit prefetch is performed and the burst length (BL) of an input/output data is 2. In case of DDR2, 4-bit prefetch is performed and the burst length of an input/output data is 4. In case of DDR3, 8-bit prefetch is performed and the burst length of an input/output data is 8. Herein, the fact that the burst length is 8 means an 8-bit data synchronized with a clock is continuously inputted/outputted through one data input/output pad.

When a memory device performs a write operation of receiving and storing a data, it may take a certain time to transfer the data inputted from the outside to a memory cell region through an internal circuit and store the data in the capacitor of each memory cell. Therefore, a write command applied from the outside should be received at a minimum time interval, which is Column Address Strobe (CAS) to CAS Delay time tCCD. For example, when a DDR3 SDRAM device performs a write operation with BL8, the time interval between the write commands that may be applied consecutively has to be at least 4tCK or longer.

FIG. 1 is a block diagram illustrating a data transfer path in a conventional memory device. It is assumed that the memory device is a DDR3 SDRAM device.

Referring to FIG. 1, the conventional memory device includes a data input pad 101, a serial-to-parallel converter 103, a data transmission unit 105, and a memory cell region 107. The serial-to-parallel converter 103 convert data that are inputted in series through the data input pad 101 and a serial data line DIN into parallel data. The parallel data are provided to the data transfer 105 through parallel data lines DINP<0:7>. The data transmission unit 105 transfers the parallel data to global data buses GIO<0:7>. The memory cell region 107 stores the data transferred through the global data buses GIO<0:7>. Herein, FIG. 1 illustrates a structure between one data input pad 101 and the memory cell region 107, and the structure may be implemented as many as the number of data input pads in the inside of a memory device.

A DDR3 SDRAM device is basically designed to perform a BL8 operation, but it may also support a BL4 operation as well. This will be described hereafter with reference to FIGS. 2A and 2B.

FIG. 2A is a timing diagram of a BL8 write operation performed in the memory device of FIG. 1.

The timing diagram illustrates that a write command and a data inputted corresponding to the write command are applied at the same clock timing. However, it is just for the sake of convenience in description and in reality, a write command may be applied first and then a data corresponding to the write command may be inputted after a write latency time passes.

Referring to FIG. 2A, when the DDR3 SDRAM device performs a write operation, write commands WT1 and WT2 are applied at a time interval of 4tCK, and 8-bit serial data D0, D1, ..., D7 and D8, D9, ..., D15 which correspond to the write commands WT1 and WT2, respectively, are inputted to the serial data line DIN through the data input pad 101. The serial-to-parallel converter 103 converts the 8-bit serial data D0, D1, ..., D7 and D8, D9, ..., D15 into 8-bit parallel data D0~D7 and D8~D15 at every 4tCK and outputs them to 8 lines DINP<0:7>. The data transmission unit 105 latches the 8-bit parallel data D0~D7 and D8~D15 inputted through the parallel data lines DINP<0:7>, and transfers them to the global data buses GIO<0:7> at a timing when a transfer enable signal ENGIO is activated to a logic high level. The transfer enable signal ENGIO is activated at a time interval of 4tCK. Subsequently, the 8-bit parallel data D0~D7 and D8~D15 are transferred to the memory cell region 107 through the global data buses GIO<0:7> and stored in a selected bank (not shown).

FIG. 2B is a timing diagram of a BL4 write operation of the memory device shown in FIG. 1.

Referring to FIG. 2B, during a BL4 write operation of the DDR3 SDRAM device, 4-bit serial data D0, D1, D2, D3 and D4, D5, D6, D7 corresponding to the write commands WT1 and WT2, respectively, are inputted to the serial data line DIN through the data input pad 101. The serial-to-parallel converter 103 converts the 4-bit serial data D0, D1, D2, D3 and D4, D5, D6, D7 into 4-bit parallel data D0~D3 and D4~D7 at every 4tCK and outputs them to the lines DINP<0:7>. Herein, among the 8 lines DINP<0:7>, four of them may be used. The data transmission unit 105 latches the 4-bit parallel data D0~D3 and D4~D7 inputted through the parallel data lines DINP<0:7> and transfers them to the global data buses GIO<0:7> at a timing when a transfer enable signal ENGIO is activated to a logic high level. Herein, too, among the 8 lines DINP<0:7>, four lines for transferring the 4-bit parallel data may be used. The transfer enable signal ENGIO is activated at a time interval of 4tCK, just as in the BL8 operation. Subsequently, the 4-bit parallel data D0~D3 and D4~D7 are transferred to the memory cell region 107 through the global data buses GIO<0:7> and stored in a selected bank (not shown).

In order to acquire the same data transfer efficiency in the BL4 operation as in the BL8 operation, the write commands WT1 and WT2 should be applied at a time interval of 2tCK, which is half the time interval of the BL8 operation. However, storing a data in a memory cell actually takes more time than a predetermined physical time, and it may also take a certain time for the global data buses GIO<0:7> to normally transfer a data, because the global data buses GIO<0:7> has a parasitic capacitance and a parasitic resistance. Therefore, during the BL4 operation, the write commands WT1 and WT2 have to be applied at a time interval of at least tCCD, which may be 4tCK.

In short, since the write commands WT1 and WT2 should be applied at a time interval of 4tCK even in the BL4 operation in the conventional memory device, just as in the BL8 operation, no data may be inputted during 2tCK of the 4tCK. Therefore, the data transfer efficiency may be decreased by half, compared with the BL8 operation.

SUMMARY

Exemplary embodiments of the present invention are directed to a data transfer circuit that is capable of increasing a data transfer efficiency during a write operation even without enlarging a data storage capacity of memory cells and data transfer capacity of global data buses, and a memory device including the data transfer circuit.

In accordance with an exemplary embodiment of the present invention, a data transfer circuit includes: a serial-to-parallel converter configured to convert multi-bit data inputted in series into parallel data by controlling the number of bits of the parallel data and a conversion timing based on an operation mode; and a data transmission unit configured to selectively transfer the parallel data to a first data path and a second data path based on the operation mode.

In accordance with another exemplary embodiment of the present invention, a memory device includes: a first bank group; a second bank group; a serial-to-parallel converter configured to convert multi-bit data inputted in series in response to a write command into parallel data by controlling the number of bits of the parallel data and a conversion timing based on an operation mode; a first global data bus configured to transfer the parallel data to the first bank group; a second global data bus configured to transfer the parallel data to the second bank group; and a data transmission unit configured to selectively transfer the parallel data to the first global data bus and the second global data bus based on the operation mode.

The serial-to-parallel converter may receive serial data of a first burst length whenever the write command is applied during a first burst mode operation, and may receive serial data of a second burst length whenever the write command is applied during a second burst mode operation. The write command may be applied at a first time interval during the first burst mode operation, and the write command may be applied at a second time interval during the second burst mode operation The data transmission unit may transfer the parallel data to a data bus selected from the first global data bus and the second global data bus during the first burst mode operation, and may transfer the parallel data alternately to the first global data bus and the second global data bus during the second burst mode operation.

The first burst length is twice as long as the second burst length, and the first time interval is twice as long as the second time interval. The data transfer interval in the first burst mode may be twice as long as the data transfer time interval in the second burst mode.

BRIEF DESCRIPTION OF THE DRAWINGS

FIG. 2B is a timing diagram of a BL4 write operation performed in the memory device shown in FIG. 1.

FIG. 7A is a timing diagram of a first burst mode (BL8) operation performed in the memory device shown in FIG. 4.

DETAILED DESCRIPTION

Figure 1:
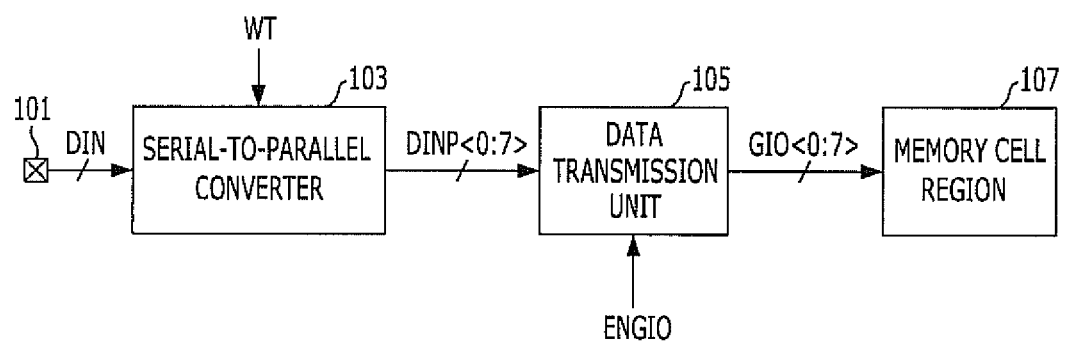
FIG. 1 is a block diagram illustrating a data transfer path in a conventional memory device.
Figure 2A:
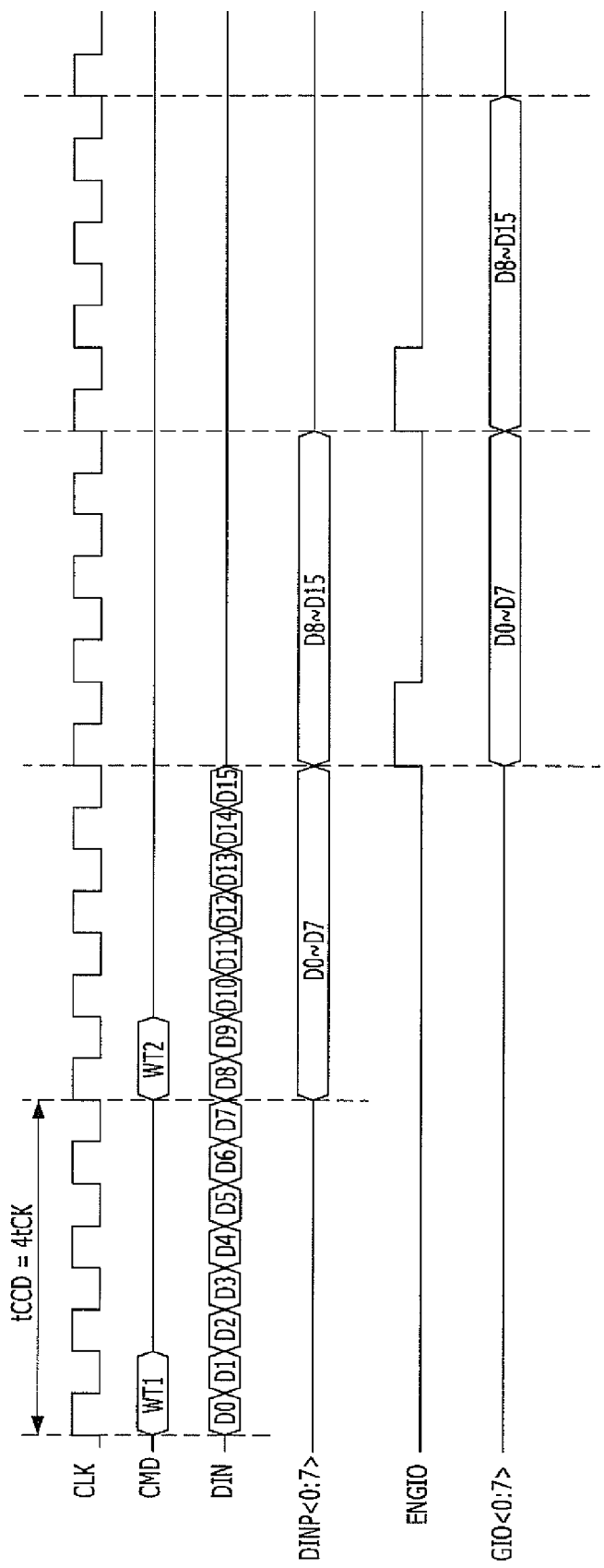
FIG. 2A is a timing diagram of a BL8 write operation performed in the memory device shown in FIG. 1.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 3:
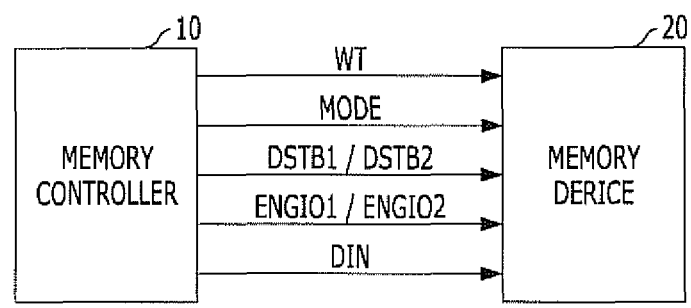
FIG. 3 is a block diagram illustrating a memory system in accordance with an exemplary embodiment of the present invention.

FIG. 3 is a block diagram illustrating a memory system in accordance with an exemplary embodiment of the present invention.

Referring to FIG. 3, the memory system includes a memory device 20 and a memory controller 10. The memory device 20 stores data based on a burst length corresponding to an operation mode when write commands WT is applied. The memory controller 10 controls a time interval between the write commands WT that are applied and the burst length corresponding to the operation mode.

The memory controller 10 generates a mode signal MODE for setting the operation mode of the memory device 20 and applies write commands WT, a first input signal DSTB1, a second input signal DSTB2, a first transfer enable signal ENGIO1 and a second transfer enable signal ENGIO2 having the time interval and the burst length corresponding to the operation mode. The first and second transfer enable signals ENGIO1 and ENGIO2 are signals for determining a data transfer timing corresponding to the operation mode in a data transfer path inside the memory device 20. The operation mode of the memory device 20 includes a first burst mode and a second burst mode. In case of DDR3 SDRAM, the first burst mode is a write operation with BL8, the second burst mode is a write operation with BL4. Herein, the mode signal MODE may be a logic high level in the first burst mode and a logic low level in the second burst mode.

In the first burst mode BL8, the memory controller 10 applies the write commands WT at a time interval of 4tCK, and activates one of the first and second input signals DSTB1 and DSTB2 and one of the first and second transfer enable signals ENGIO1 and ENGIO2 at a time interval of 4tCK. In the second burst mode BL4, the memory controller 10 applies the write commands WT at a time interval of 2tCK, activates alternatively the first and second input signals DSTB1 and DSTB2 at a time interval of 2tCK, and activates alternatively the first and second transfer enable signals ENGIO1 and ENGIO2. Thus, the data transfer circuit may increase the operation speed and data transfer efficiency of a memory device 20 by reducing the time interval in the second burst mode BL4.

Figure 4:
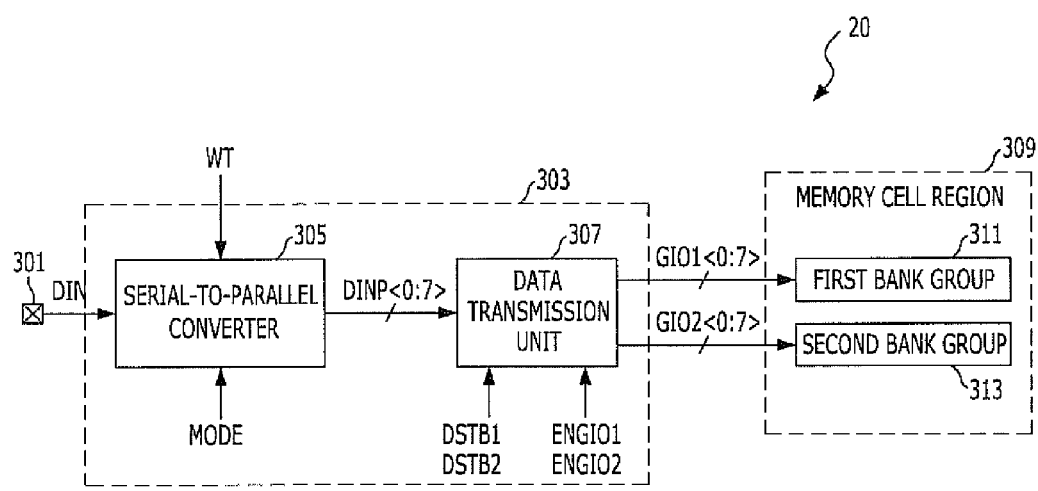
FIG. 4 is a block diagram illustrating a memory device in accordance with an exemplary embodiment of the present invention.

FIG. 4 is a block diagram illustrating a memory device 20 shown in FIG. 3 in accordance with an embodiment of the present invention.

Referring to FIG. 4, the memory device 20 includes a data input pad 301, a memory cell region 309, a serial-to-parallel converter 305, a first global data bus GIO1<0:7>, a second global data bus GIO2<0:7>, and a data transmission unit 307. The memory cell region 309 includes a first bank group 311 and a second bank group 313. The serial-to-parallel converter 305 converts multi-bit data inputted in series into parallel data in response to a write command WT by controlling a conversion timing and the number of bits of the converted data according to the operation mode. The first global data bus GIO1<0:7> transfers the parallel data to the first bank group 311. The second global data bus GIO2<0:7> transfers the parallel data to the second bank group 313. The data transmission unit 307 transfers the parallel data, which are obtained from the data conversion process according to the operation mode, to the first global data bus GIO1<0:7> or the second global data bus GIO2<0:7>. The serial-to-parallel converter 305 and the data transmission unit 307 constitute a data transfer circuit 303.

Herein, FIG. 3 illustrates a structure between one data input pad 301 and the memory cell region 309, and the structure may be implemented as many as the number of data input pads in the inside of the memory device 20.

Each of the first bank group 311 and the second bank group 313 contained in the inside of the memory cell region 309 may include more than two banks (not shown). In the memory device 20 fabricated in accordance with the exemplary embodiment of the present invention, a data inputted in response to a write command is selectively transferred to any one of the first bank group 311 and the second bank group 313 through the first global data bus GIO1<0:7> or the second global data bus GIO2<0:7>, and stored in a selected bank of the corresponding bank group.

In the embodiment of the present invention, the memory device 20 may includes a DDR3 SDRAM device. Therefore, as mentioned earlier, both BL8 operation and BL4 operation is provided therein. Hereafter, the BL8 operation will be referred to as a first burst mode and the BL4 operation will be referred to as a second burst mode.

In the first burst mode (BL8), write commands are applied at a time interval of 4tCK, and whenever a write command is applied, an 8-bit data is inputted and transferred to a corresponding bank group through any one of the first global data bus GIO1<0:7> and the second global data bus GIO2<0:7>.

In the second burst mode (BL4), write commands are applied at a time interval of 2tCK, and whenever a write command is applied, a 4-bit data is inputted and transferred to the first bank group 311 and the second bank group 313 through the first global data bus GIO1<0:7> and the second global data bus GIO2<0:7> alternately. The operation in each mode will be described in detail with reference to FIGS. 7A and 7B.

Figure 5:
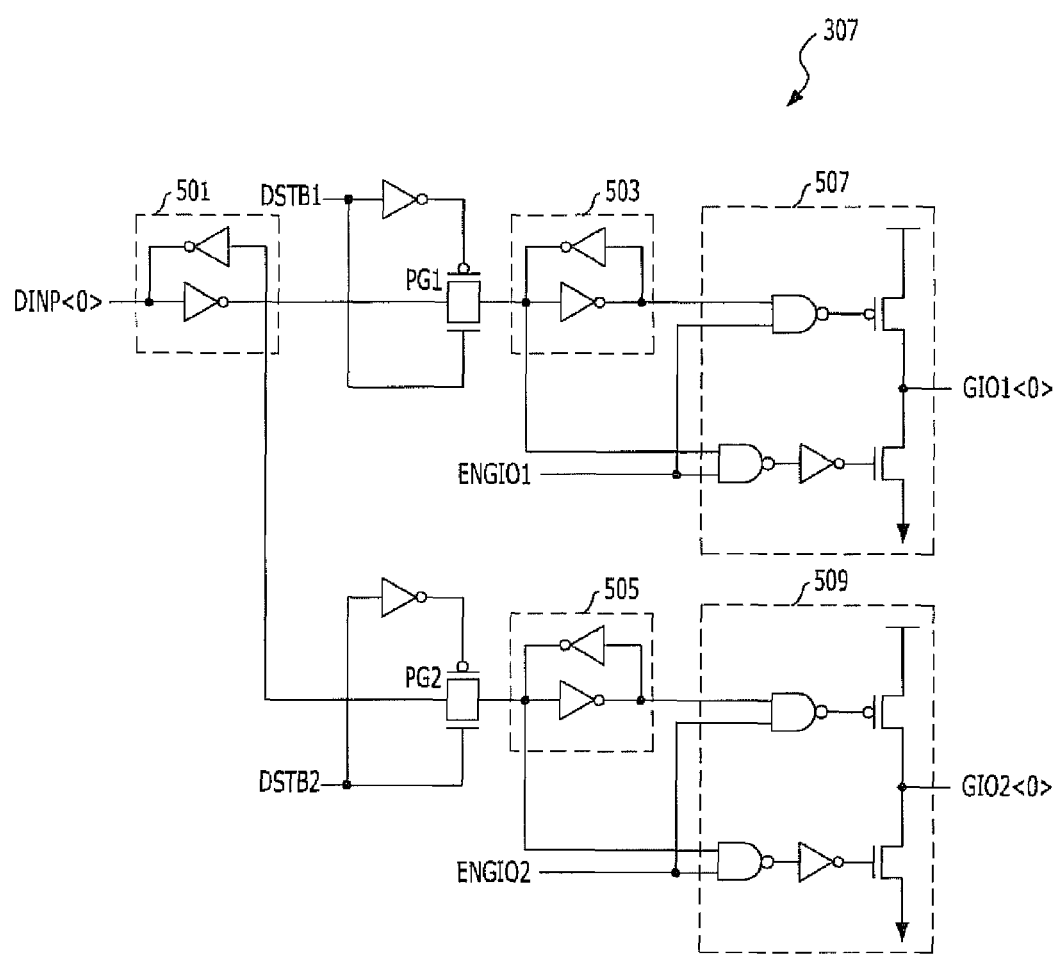
FIG. 5 is a schematic diagram of a data transmission unit of the memory device shown in FIG. 4.

FIG. 5 is a schematic diagram of the data transmission unit 307 of the memory device 20 shown in FIG. 4.

Hereafter, the operation of the data transmission unit 307 is described in detail through a circuit structure which transfers one-bit data inputted from a line DINP<0> to a first global data bus GIO1<0> or a second global data bus GIO2<0>. The data transmission unit 307 may include the same 8 structures as the lines DINP<0:7> and the first global data bus GIO1<0:7> and the second global data bus GIO2<0:7>. For the illustrative purpose, a circuit for one line DINP<0>, a first global data bus GIO1<0> and a second global data bus GIO1<0> is only shown in FIG. 5 and described. The remaining circuits for the other lines have the same configuration as the circuit shown in FIG. 5.

Referring to FIG. 5, the data transmission unit 307 may include first to third latch units 501, 503 and 505, first and second pass gates PG1 and PG2, and first and second output units 507 and 509. The data transmission unit 307 may operate in response to first and second input signals DSTB1 and DSTB2 and the first transfer enable signal ENGIO1 and the second transfer enable signal ENGIO2.

The data inputted through the line DINP<0> is first stored in the first latch unit 501, and when the first input signal DSTB1 is activated to a logic high level, it passes through the first pass gate PG1 and stored in the second latch unit 503. When the second input signal DSTB2 is activated to a logic high level, it passes through the second pass gate PG2 and stored in the third latch unit 505.

The data stored in the second latch unit 503 is outputted by the first output unit 507 to the first global data bus GIO1<0> when the first transfer enable signal ENGIO1 is activated to a logic high level. The first output unit 507, as shown, may include two NAND gates, an inverter, a PMOS transistor, and an NMOS transistor. When the logic value of a data inputted through the second latch unit 503 is a logic high level and the first transfer enable signal ENGIO1 becomes a logic high level, the data is outputted to have a logic high value. When the logic value of the data is a logic low level and the first transfer enable signal ENGIO1 becomes a logic high level, the data is outputted to have a logic low value.

The data stored in the third latch unit 505 is outputted by the second output unit 509 to the second global data bus GIO2<O> when the second transfer enable signal ENGIO2 is activated to a logic high level. The second output unit 509 is operated in the similar manner as the first output unit 507. When the logic value of a data inputted through the third latch unit 505 is a logic high level and the second transfer enable signal ENGIO2 becomes a logic high level, the data is outputted to have a logic high value. When the logic value of the data is a logic low level and the second transfer enable signal ENGIO2 becomes a logic high level, the data is outputted to have a logic low value.

Figure 6:
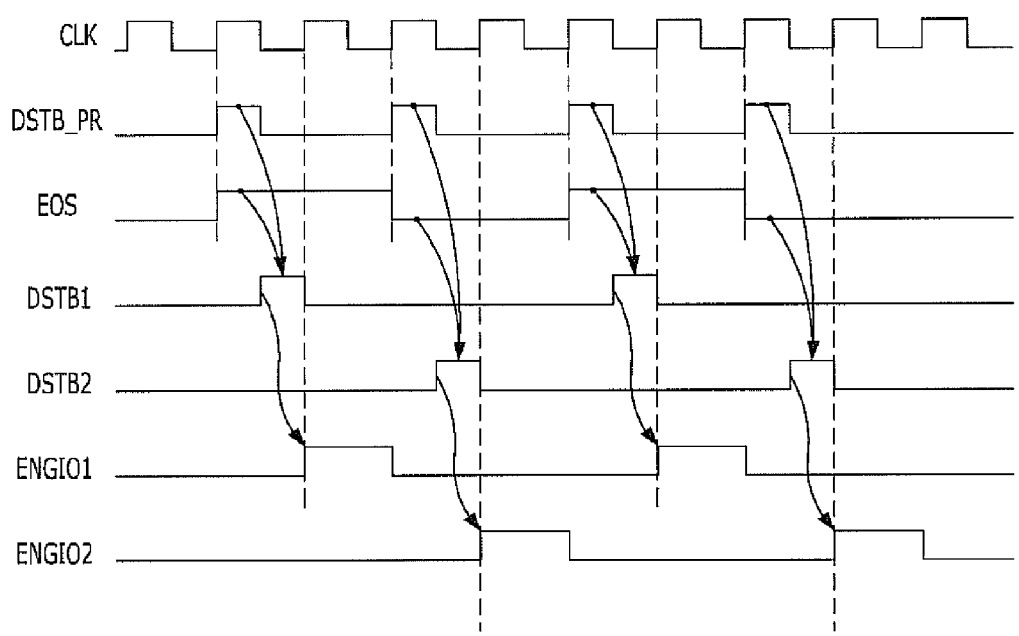
FIG. 6 is a timing diagram illustrating a process of generating control signals in the data transmission unit of FIG. 5 in the second burst mode (BL4).

FIG. 6 is a timing diagram illustrating a process of generating control signals in the data transmission unit 307 shown in FIG. 5 in the second burst mode BL4. The control signals are generated in the memory controller 10.

During the second burst mode (BL4) operation, when write commands are applied at a time interval of 2tCK, a preliminary input signal DSTB_PR is activated at every 2tCK in response to the write commands applied at a time interval of 2tCK. Whenever the preliminary input signal DSTB_PR is activated, a path deciding signal EOS is changed from a logic high level to a logic low level or from a logic low level to a logic high level.

First and second input signals DSTB1 and DSTB2 may be generated as a combination of the preliminary input signal DSTB_PR and the path deciding signal EOS. Specifically, when the preliminary input signal DSTB_PR is in a logic high level and the path deciding signal EOS is in a logic high level, the first input signal DSTB1 is activated to a logic high level. When the preliminary input signal DSTB_PR is in a logic high level and the path deciding signal EOS is in a logic low level, the second input signal DSTB2 is activated to a logic high level.

The first transfer enable signal ENGIO1 and the second transfer enable signal ENGIO2 may be generated in response to the first input signal DSTB1 and the second input signal DSTB2, respectively. As shown, when the first input signal DSTB1 is activated to a logic high level, the first transfer enable signal ENGIO1 is activated to a logic high level after a half clock ½tCK. Likewise, when the second input signal DSTB2 is activated to a logic high level, the second transfer enable signal ENGIO2 is activated to a logic high level after a half clock ½tCK.

In the similar way, the first input signal DSTB1 and the first transfer enable signal ENGIO1 can be activated in response to a write command applied in an odd$^{th}$ number and the second input signal DSTB2 and the second transfer enable signal ENGIO2 can be activated in response to a write command applied in an even$^{th}$ number. The generation of the control signals may occur in a memory controller which controls the overall operation of a memory device 20.

Figure 7B:
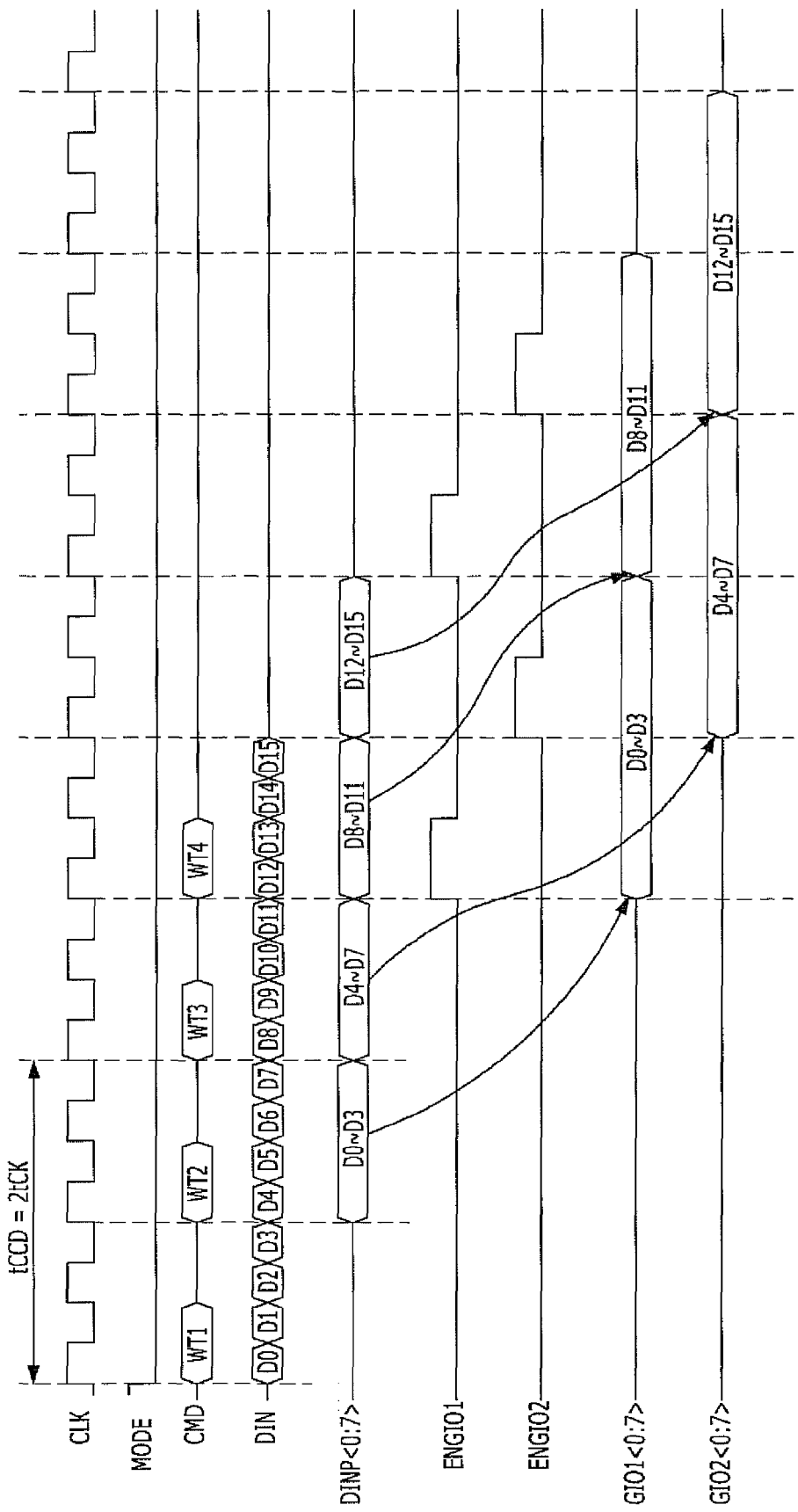
FIG. 7B is a timing diagram of a second burst mode (BL4) operation performed in the memory device shown in FIG. 4.

FIG. 7A is a timing diagram of the first burst mode (BL8) operation performed in the memory device 20 of FIG. 4, and FIG. 7B is a timing diagram of the second burst mode (BL4) operation performed in the memory device 20 of FIG. 4.

The serial-to-parallel converter 305 operates in response to a mode signal MODE. Specifically, when a mode signal MODE is in a logic high level, the serial-to-parallel converter 305 operates in the first burst mode (BL8). When the mode signal MODE is in a logic low level, the serial-to-parallel converter 305 operates in the second burst mode (BL4).

In the first burst mode (BL8) operation shown in FIG. 4A, the time interval tCCD when write commands WT1 and WT2 are consecutively applied is 4tCK, and whenever each of the write commands WT1 and WT2 is applied, serial data D0, D1, . . . , D7 and D8, D9, . . . , D15 of the first burst length, which is 8, are inputted consecutively. The serial-to-parallel converter 305 converts the inputted 8-bit serial data D0, D1, . . . , D7 and D8, D9, . . . , D15 into parallel data at a first time interval, which is 4tCK, and outputs them to 8 lines DINP<0:7>.

In the second burst mode (BL4) operation shown in FIG. 4B, the time interval tCCD when write commands WT1, WT2, WT3 and WT4 are consecutively applied is 2tCK, and whenever each of the write commands WT1, WT2, WT3 and WT4 is applied, serial data D0, D1, D2, D3/D4, D5, D6, D7/D8, D9, D10, Dill and D12, D13, D14, D15 of the second burst length, which is 4, are inputted consecutively. The serial-to-parallel converter 305 converts the inputted 4-bit serial data D0, D1, D2, D3/D4, D5, D6, D7/D8, D9, D10, D11/and D12, D13, D14, D15 into parallel data at a second time interval, which is 2tCK, and outputs them to 4 lines of the 8 parallel data lines DINP<0:7>.

The data transmission unit 307 may operate in response to a first transfer enable signal ENGIO1 and a second transfer enable signal ENGIO2. Specifically, the data transmission unit 307 latches the parallel data inputted through the parallel data lines DINP<0:7> and when the first transfer enable signal ENGIO1 is activated to a logic high level, the data transmission unit 307 transfers the parallel data to the first global data bus GIO1<0:7>, and when the second transfer enable signal ENGIO2 is activated to a logic high level, the data transmission unit 307 transfers the parallel data to the second global data bus GIO2<0:7>.

During the first burst mode (BL8) operation shown in FIG. 4A, the operation of the data transmission unit 307 is similar to that of a conventional data transmission unit. If any, since the first global data bus GIO1<0:7> and the second global data bus GIO2<0:7> are determined corresponding to the first bank group 311 and the second bank group 313, any one of the first transfer enable signal ENGIO1 and the second transfer enable signal ENGIO2 is selectively activated at a time interval of 4tCK corresponding to a bank group in which a data is to be stored, and the data is transferred to a global data bus corresponding to the activated output signal.

During the second burst mode (BL4) operation shown in FIG. 4B, the write commands WT1, WT2, WT3 and WT4 are inputted at a time interval of 2tCK, which is a half of the conventional tCCK (4tCK), and the parallel data obtained therefrom are inputted to the data transmission unit 307 at a time interval of 2tCK. However, as described above, the data should be applied to one global data bus at a time interval of at least 4tCK for stable transfer and storage. Therefore, the data transmission unit 307 transfers the data alternately to the first global data bus GIO1<0:7> and the second global data bus GIO2<0:7>.

As illustrated in FIG. 4B, the first transfer enable signal ENGIO1 and the second transfer enable signal ENGIO2 are activated to a logic high level alternately at a time interval of 2tCK. Accordingly, first parallel data D0~D3 are transferred to the first global data bus GIO1<0:7>, and second parallel data D4~D7 are transferred to the second global data bus GIO2<0:7>. Third parallel data D8~D11 are transferred to the first global data bus GIO1<0:7> again, and fourth parallel data D12~D15 are transferred to the second global data bus GIO2<0:7> again. Herein, the first transfer enable signal ENGIO1 may be activated in response to the odd-number write commands WT1 and WT3, and the second transfer enable signal ENGIO2 may be activated in response to the even-number write commands WT2 and WT4.

Also, among the first global data bus GIO1<0:7> and the second global data bus GIO2<0:7>, the 4-bit parallel data may be transferred through 4 lines of the 8 parallel data lines.

In this way, all data may be stable transferred to the memory cell region 309 in response to the write commands inputted at a time interval of 2tCK and may store the data in the selected banks of the first bank group 311 or the second bank group 313, while maintaining the time interval when a data is loaded on one global data bus at 4tCK. Therefore, the operation speed and the data transfer efficiency may be substantially increased twice, compared with the conventional BL4 operation.

Meanwhile, the DDR3 SDRAM which performs an 8-bit prefetch operation is taken as an example to describe the exemplary embodiment of the present invention, but the technological concept of the present invention may be applied to diverse kinds of memory devices which consecutively receive multi-bit data.

Also, this embodiment of the present invention describes a case where the memory cell region is divided into two bank groups. However, when a memory cell region is divided into more than two bank groups and more than two global data buses are formed corresponding to the bank groups, the technological concept of the present invention may be modified such as two bank groups among the bank groups are selected or data are alternately transferred to the global data buses.

As described above, the data transmission circuit and a memory device 20 including the same in accordance with an exemplary embodiment of the present invention controls the time interval for applying write commands based on the burst length of data by introducing bank grouping and improving the transfer characteristics of inputted data to the global data buses which respectively correspond to bank groups without any specific improvement in the data storage characteristics of memory cells or the data transfer characteristics of the global data buses. Thus, the data transmission circuit may increase the operation speed and data transfer efficiency of a memory device by reducing the time interval when write commands are applied, when a memory device operates with a short burst length.

According to the exemplary embodiment of the present invention, the time interval for applying write commands may be controlled based on the burst length of data by introducing bank grouping and improving the process of transferring inputted data to global data buses respectively corresponding to bank groups. In other words, a memory device may be implemented to receive and store data when the memory device operates with a short burst length and write commands are applied at a shorter time interval than conventional tCCD.

Also, when the memory device operates with a short burst length, the operation speed and data transfer efficiency of a memory device may be improved considerably by reducing the time interval for applying write commands.

While the present invention has been described with respect to the specific embodiments, it will be apparent to those skilled in the art that various changes and modifications may be made without departing from the spirit and scope of the invention as defined in the following claims.

What is claimed is:

1. A data transfer circuit, comprising:
    a serial-to-parallel converter configured to convert multi-bit data inputted in series into parallel data while controlling a number of bits of the parallel data and a conversion timing based on a burst length; and
    a data transmission unit configured to transfer the parallel data to a first data path or a second data path based on an operation mode,
    wherein the data transmission unit is configured to transfer the parallel data alternately to the first data path and the second data path during a predetermined burst mode.

2. The data transfer circuit of claim 1, wherein the serial-to-parallel converter is configured to:
    convert serial data of a first burst length at a first time interval during a first burst mode operation; and
    convert serial data of a second burst length at a second time interval during a second burst mode operation.

3. The data transfer circuit of claim 2, wherein the second burst length includes a half of the first burst length.

4. The data transfer circuit of claim 2, wherein the second time interval includes a half of the first time interval.

5. The data transfer circuit of claim 2, wherein the data transmission unit is configured to transfer the parallel data alternately to the first data path and the second data path during the second burst mode operation.

6. The data transfer circuit of claim 2, wherein the data transmission unit is configured to transfer the parallel data to a data path selected from the first data path and the second data path during a first burst mode.

7. The data transfer circuit of claim 6, wherein a data transfer time interval in a second burst mode is a half of a data transfer time interval in the first burst mode.

8. A memory device, comprising:
    a first bank group;
    a second bank group;
    a serial-to-parallel converter configured to convert multi-bit data inputted in series in response to a write command into parallel data by controlling a number of bits of the parallel data and a conversion timing based on a burst length;
    a first global data bus configured to transfer the parallel data to the first bank group;
    a second global data bus configured to transfer the parallel data to the second bank group; and
    a data transmission unit configured to selectively transfer the parallel data to the first global data bus and the second global data bus based on an operation mode,
    wherein the data transmission unit transfer the parallel data alternately to the first global data bus and the second global data bus during a predetermined burst length mode operation.

9. The memory device of claim 8, wherein the serial-to-parallel converter is configured to;
    receive serial data of a first burst length whenever the write command is applied during a first burst mode operation; and
    receive serial data of a second burst length whenever the write command is applied during a second burst mode operation.

10. The memory device of claim 9, wherein a time interval for consecutively applying the write command during the second burst mode operation is a half of a time interval for consecutively applying the write command during the first burst mode operation.

11. The memory device of claim 9, wherein the serial-to-parallel converter is configured to:
    convert serial data of the first burst length into parallel data at a first time interval during the first burst mode operation; and
    convert serial data of the second burst length into parallel data at a second time interval during the second burst mode operation.

12. The memory device of claim 11, wherein the second burst length includes a half of the first burst length.

13. The memory device of claim 11, wherein the first time interval and the second time interval are substantially identical to the time interval for consecutively applying the write command in a corresponding operation mode.

14. The memory device of claim 9, wherein the data transmission unit is configured to:
    transfer the parallel data to a data bus selected from the first global data bus and the second global data bus during the first burst mode operation; and
    transfer the parallel data alternately to the first global data bus and the second global data bus during the second burst mode operation.

15. The memory device of claim 14, wherein a data transfer time interval in the second burst mode of the data transmission unit includes a half of a data transfer time interval in the first burst mode.

16. The memory device of claim 8, wherein each of the first bank group and the second bank group includes more than two memory banks.

* * * * *